US008878614B2

(12) United States Patent
Yin et al.

(10) Patent No.: US 8,878,614 B2
(45) Date of Patent: Nov. 4, 2014

(54) PHASE-LOCKED LOOP (75) Inventors: Wenjing Yin, San Diego, CA (US);
Anand Gopalan, Belmont, CA (US)

(73) Assignee: MegaChips Corporation, Osaka-shi (JP)

( * ) Notice: Subject to any disclaimer, the term of this patent is extended or adjusted under 35 U.S.C. 154(b) by 183 days.

(21) Appl. No.: 13/407,334

(22) Filed: Feb. 28, 2012

(65) Prior Publication Data
US 2013/0222067 A1    Aug. 29, 2013

(51) Int. Cl.
H03L 7/00    (2006.01)

(52) U.S. Cl.
USPC ............. 331/25; 327/147; 327/150; 327/156; 327/159; 375/376; 331/10; 331/17; 331/34; 331/57; 331/117 R; 331/117 FE; 331/167; 331/177 R; 331/185; 331/186

(58) Field of Classification Search
USPC ........ 327/147, 150, 156, 159; 331/10, 17, 34, 331/57, 117 R, 167, 177 R, 185, 186, 25, 331/117 FE; 375/376
See application file for complete search history.

(56) References Cited

U.S. PATENT DOCUMENTS

| 6,316,987 | B1 | 11/2001 | Dally et al. |
| 7,009,456 | B2 | 3/2006 | Jasa et al. |
| 7,177,611 | B2* | 2/2007 | Goldman ....................... 455/260 |
| 7,315,217 | B2* | 1/2008 | Galloway et al. ............... 331/34 |
| 8,031,027 | B2 | 10/2011 | Park et al. |
| 2006/0255864 | A1* | 11/2006 | Vandel ............................. 331/16 |
| 2010/0118894 | A1 | 5/2010 | Aweya et al. |
| 2010/0271140 | A1* | 10/2010 | Raghunathan et al. ......... 331/34 |
| 2011/0006851 | A1* | 1/2011 | Kim ................................ 331/57 |

OTHER PUBLICATIONS

Hanumolu, P.K. et al., "Digitally-Enhanced Phase-Locking Circuits," IEEE 2007 Custom Intergrated Circuits Conference, pp. 361-368.
Staszewski, R.B. et al., "All Digital PLL and Transmitter for Mobile Phones," IEEE Journal of Solid-State Circuits, vol. 40, No. 12, pp. 2469-2482, Dec. 2005.
Lin, J. et al., "A PVT Tolerant 0.18MHz to 600MHz Self-Calibrated Digital PLL in 90nm CMOS Process," 2004 IEEE International Solid-State Circuits Conference, Session 26.
Song, M. et al., "A 10MHz to 315MHz Cascaded Hybrid PLL with Piecewise Linear Calibrated TDC," IEEE 2009 Custom Intergrated Circuits Conference, pp. 243-246.

(Continued)

Primary Examiner — Arnold Kinkead
Assistant Examiner — Richard Tan
(74) Attorney, Agent, or Firm — Oblon, Spivak, McClelland, Maier & Neustadt, L.L.P.

(57) ABSTRACT

A PLL circuit includes an oscillator, a detection block, an integral path and a proportional path. The oscillator generates an oscillation signal. The detection block detects a phase difference between the oscillation signal and a reference signal and generates an integral signal that represents an integral value of the phase difference and a proportional signal that represents a current value of the phase difference. The integral path includes a regulator that receives the integral signal and supplies a regulated integral signal to the oscillator, and the regulator has a feedback loop including an error amplifier. The proportional path supplies the proportional signal, separately from the integral signal, to the oscillator. The oscillator generates the oscillation signal having an oscillation frequency controlled by both of the regulated integral signal and the proportional signal such that the phase of the oscillation signal is locked to the phase of the reference signal.

12 Claims, 6 Drawing Sheets (56) References Cited

OTHER PUBLICATIONS

Tierno, J.A. et al., "A Wide Power Supply Range, Wide Tuning Range, All Static CMOS All Digital PLL in 65 nm SOI," IEEE Journal of Solid-State Circuits, vol. 43, No. 1, pp. 42-51, Jan. 2008.

Kim, D. et al., "A 1.35GHz All-Digital Fractional-N PLL with Adaptive Loop Gain Controller and Fractional Divider," IEEE Asian Solid-State Circuits Conference, Nov. 16-18, 2009, Taipei, Taiwan.

Kratyuk, V. et al., "A Digital PLL with a Stochastic Time-to-Digital Converter," 2006 Symposium on VLSI Circuits Digest of Technical Papers.

Staszewski, R.B. et al., "1.3 V 20 ps Time-to-Digital Converter for Frequency Synthesis in 90-nm CMOS," IEEE Transactions on Circuits and Systems—II: Express Briefs, vol. 53, No. 3, pp. 220-224, Mar. 2006.

Lee, M. et al., "A 9 b, 1.25 ps Resolution Coarse-Fine Time-to-Digital Converter in 90 nm CMOS that Amplifies a Time Residue," IEEE Journal of Solid-State Circuits, vol. 43, No. 4, pp. 769-777, Apr. 2008.

Straayer, M.Z. et al., "A Multi-Path Gated Ring Oscillator TDC with First-Order Noise Shaping," IEEE Journal of Solid-State Circuits, vol. 44, No. 4, pp. 1089-1098, Apr. 2009.

Wang, P. et al., "A Digital Intensive Fractional-N PLL and All-Digital Self-Calibration Schemes," IEEE Journal of Solid-State Circuits, vol. 44, No. 8, pp. 2182-2192, Aug. 2009.

Yin, W. et al., "A 1.6mW 1.6ps-rms-Jitter 2.5GHz Digital PLL with 0.7-to-3.5GHz Frequency Range in 90nm CMOS," 2010 IEEE.

Chen, P. et al., "A Portable Digitally Controlled Oscillator Using Novel Varactors," IEEE Transactions on Circuits and Systems—II: Express Briefs, vol. 52, No. 5, pp. 233-237, May 2005.

Staszewski, R.B. et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, vol. 50, No. 11, pp. 815-828, Nov. 2003.

Chung, C. et al., "An All-Digital Phase-Locked Loop for High-Speed Clock Generation," IEEE Journal of Solid-State Circuits, vol. 38, No. 2, pp. 347-351, Feb. 2003.

Hwang, I., et al., "A Digitally Controlled Phase-Locked Loop With a Digital Phase-Frequency Detector for Fast Acquisition," IEEE Journal of Solid-State Circuits, vol. 36, No. 10, pp. 1574-1581, Oct. 2001.

Yin, W., et al., "A 0.7-to-3.5 GHz 0.6-to-2.8 mW Highly Digital Phase-Locked Loop With Bandwidth Tracking," IEEE Journal of Solid-State Circuits, vol. 46, No. 8, pp. 1870-1880, Aug. 2011.

Elshazly, A., et al., "A 0.4-to-3GHz Digital PLL with Supply-Noise Cancellation Using Deterministic Background Calibration," 2011 IEEE International Solid-State Circuits Conference, Session 5, pp. 92-94.

* cited by examiner

PHASE-LOCKED LOOP

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Phase-locked loops (PLLs) are widely used in the electronic devices for clock generation, data extraction and re-timing, for example. Desirable features of a PLL include low jitter, low power, small area, wide operating range, immunity to process, voltage, and temperature variations, and the like.

SUMMARY

Aspects of the disclosure provide a phase-locked loop circuit. The phase-locked loop circuit includes an oscillator, a detection block, an integral path and a proportional path. The oscillator generates an oscillation signal, and has a power-supply terminal and a control terminal. The detection block detects a phase difference between a phase of the oscillation signal and a phase of a reference signal and generates an integral signal that represents an integral or cumulative value of the phase difference and a proportional signal that represents a current value of the phase difference. The integral path includes a regulator that receives the integral signal and supplies a regulated integral signal to the power-supply terminal of the oscillator, and the regulator has a feedback loop including an error amplifier. The proportional path supplies the proportional signal, separately from the integral signal, to the control terminal of the oscillator. The oscillator generates the oscillation signal having an oscillation frequency controlled by both of the regulated integral signal and the proportional signal such that the phase of the oscillation signal is locked to the phase of the reference signal.

In an embodiment, the phase-locked loop circuit further includes a divider that divides the oscillation signal to generate a divided oscillation signal, and the detection block detects the phase difference by comparing a phase of the divided oscillation signal and the phase of the reference signal.

Further, in an example, the detection block generates, as the proportional signal, up and down signals based on the phase difference, and the proportional path supplies the up and down signals to the control terminal of the oscillator.

According to an aspect of the disclosure, the integral path supplies the regulated integral signal to the power-supply terminal of the oscillator in an analog form, and the proportional path supplies the proportional signal to the control terminal of the oscillator in a digital form to select selectable circuit components to adjust the oscillation frequency.

According to another aspect of the disclosure, the oscillator is a ring oscillator having a plurality of delay cells connected in series. Each of the delay cells includes the selectable circuit components.

In an embodiment, the regulator is a voltage regulator, and the oscillator is a voltage-controlled oscillator that generates the oscillation signal having the oscillation frequency dependent on a voltage of the regulated integral signal. In an example, the oscillator is a ring oscillator having a plurality of delay cells connected in series. Each of the delay cells includes a plurality of branches including respective inverters and switches to connect the inverters in parallel with each other. The proportional signal selects a number of the branches connected in parallel in each of the delay cells.

In another embodiment, the regulator is a current regulator, and the oscillator is a current-controlled oscillator that generates the oscillation signal having the oscillation frequency dependent on a current of the regulated integral signal.

Aspects of the disclosure provide another phase-locked loop circuit. The phase-locked loop circuit also includes an oscillator, a detection block, an integral path and a proportional path. The oscillator generates an oscillation signal. The detection block detects a phase difference between a phase of the oscillation signal and a phase of a reference signal and generates an integral signal that represents an integral value of the phase difference and a proportional signal that represents a current value of the phase difference. The integral path includes a regulator that receives the integral signal and supplies a regulated integral signal to the oscillator, and the regulator has a feedback loop including an error amplifier. The proportional path supplies the proportional signal, separately from the integral signal, to the oscillator. The oscillator generates the oscillation signal having an oscillation frequency controlled by both of the regulated integral signal and the proportional signal such that the phase of the oscillation signal is locked to the phase of the reference signal.

In an example, the oscillator is an inductor-capacitor (LC) type oscillator having at least a varactor and a plurality of selectable capacitors. The integral path provides the regulated integral signal to the varactor to adjust a capacitance of the varactor, and the proportional signal selects a number of the selectable capacitors in the oscillator.

Aspects of the disclosure provide a method of improving a power supply rejection ratio of a phase-locked loop circuit. The method includes generating an oscillation signal having an oscillation frequency by using an oscillator having a power-supply terminal and a control terminal, detecting a phase difference between a phase of the oscillation signal and a phase of a reference signal, generating an integral signal that represents an integral value of the phase difference and a proportional signal that represents a current value of the phase difference, regulating the integral signal using a regulator having a feedback loop including an error amplifier, supplying the regulated integral signal to the power-supply terminal of the oscillator, and supplying the proportional signal, separately from the integral signal, to the control terminal of the oscillator. To generate the oscillation signal, the method includes controlling the oscillation frequency by using both of the regulated integral signal and the proportional signal such that the phase of the oscillation signal is locked to the phase of the reference signal.

Aspects of the disclosure provide another method of improving a power supply rejection ratio of a phase-locked loop circuit. The method includes generating an oscillation signal having an oscillation frequency by using an oscillator, detecting a phase difference between a phase of the oscillation signal and a phase of a reference signal, generating an integral signal that represents an integral value of the phase difference and a proportional signal that represents a current value of the phase difference, regulating the integral signal using a regulator having a feedback loop including an error amplifier, supplying the regulated integral signal to the oscillator, and supplying the proportional signal, separately from the integral signal, to the oscillator. To generate the oscillation signal, the method includes controlling the oscillation frequency by using both of the regulated integral signal and the proportional signal such that the phase of the oscillation signal is locked to the phase of the reference signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
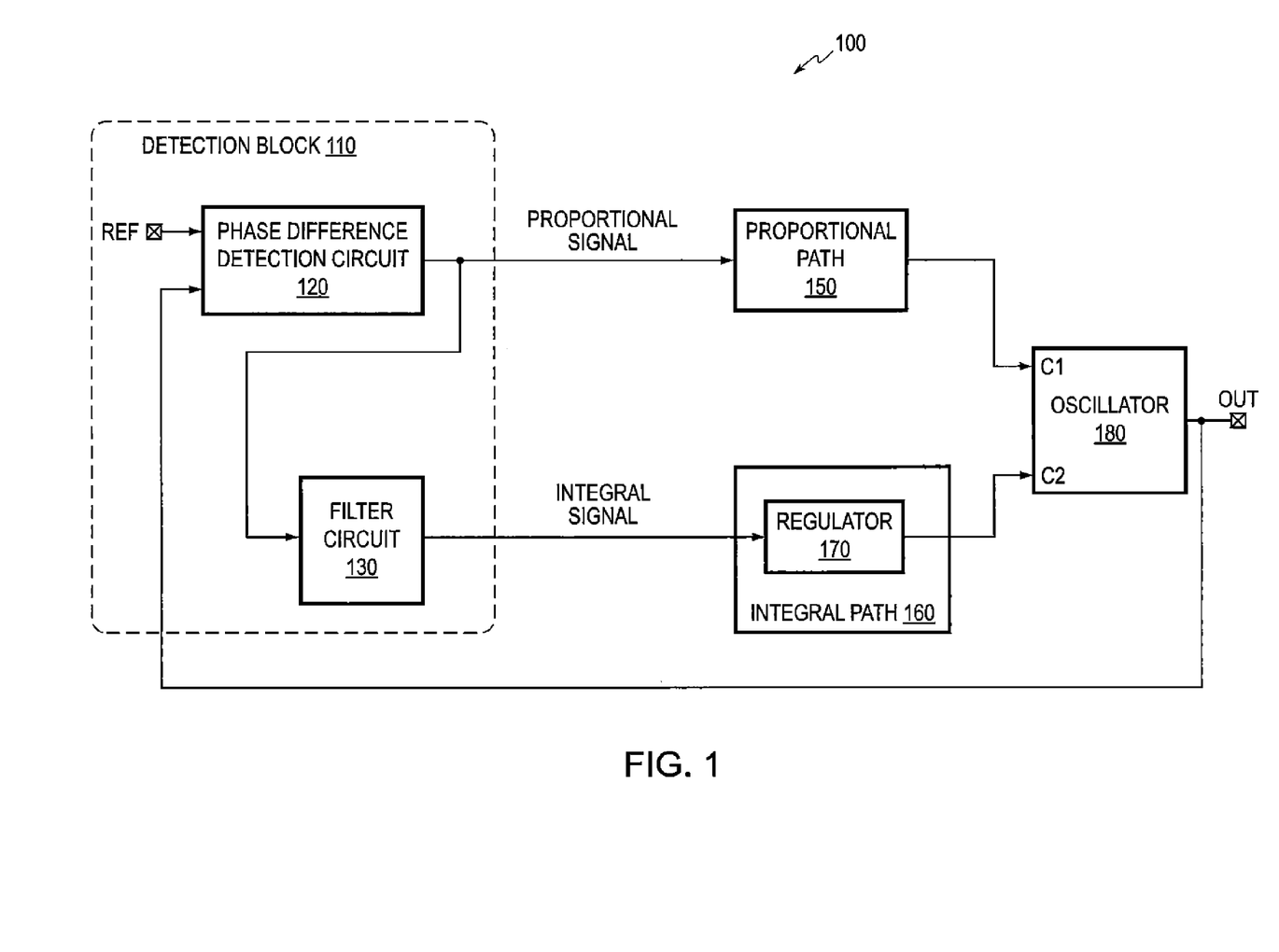
FIG. 1 shows an exemplary block diagram of a phase-locked loop 100 according to an embodiment of the disclosure.

FIG. 1 shows a block diagram of a phase-locked loop (PLL) 100 according to an exemplary embodiment of the disclosure. The PLL 100 generates an output signal (OUT) with a phase locked to a reference signal (REF). The PLL 100 includes a detection block 110 that generates a proportional signal indicative of a phase difference between the OUT and REF, and an integral signal indicative of a relatively low frequency component of the cumulative phase difference. The PLL 100 also includes an oscillator 180 having at least two controllable parameters, a proportional path 150 that controls one of the controllable parameters based on the proportional signal, and an integral path 160 that controls another of the control parameters based on the integral signal. The above elements can be coupled together as shown in FIG. 1.

The detection block 110 can use any suitable techniques to generate the proportional signal and the integral signal. In the FIG. 1 example, the detection block 110 includes a phase difference detection circuit 120 and a filter circuit 130. The phase difference detection circuit 120 receives the signals OUT and REF, and generates the proportional signal indicative of the phase difference between OUT and REF. The filter circuit 130 receives and continuously integrates the value to generate the integral signal. The filter circuit 130 also removes the high frequency components and smoothes out the proportional signal to generate the integral signal.

In an embodiment, the phase difference detection circuit 120 is implemented as a phase frequency detector that outputs a pair of signals, such as a UP signal and a DN signal, with variable width pulses. The widths of the pulses are varied based on the phase difference between OUT and REF. For example, when REF is ahead of OUT by a positive phase difference, the phase frequency detector outputs a pulse in the UP signal, and the pulse has a pulse width proportional to the positive phase difference. When REF is behind OUT by a positive phase difference, the phase frequency detector outputs a pulse in the DN signal, and the purse has a pulse width proportional to the positive phase difference.

Further, in an embodiment, the filter circuit 130 is implemented as a digital loop filter to generate the integral signal using digital signal processing techniques. In an example, the UP signal and the DN signal are used to generate a digital signal indicative of the phase difference. Then, the filter circuit 130 includes an accumulator to generate the integral signal with high frequency components averaged out. It is noted that other implementations, such as using time to digital converter (TDC) to detect the phase difference, using charge pump based loop filter to filter out the high frequency components, and the like may also be used.

The oscillator 180 can use any suitable techniques to generate the oscillating signal OUT based on at least two controllable parameters, such as C1 and C2, that are separately controlled based on the proportional signal and the integral signal. The frequency of the oscillating signal OUT is adjusted according to the control parameters.

In an embodiment, the oscillator 180 is implemented as a voltage controlled oscillator (VCO) that the frequency of the oscillating signal OUT is a function of a control voltage. In addition, the VCO has another controllable parameter. When the VCO has a ring oscillator topology including serially connected delay cells, for example, a number of delay cells, a size of a delay cell, a value of a load capacitance of the delay cell, a current through the delay cell, and the like can be used to control the frequency of the oscillating signal OUT. The proportional signal and the integral signal are separately used to adjust the control voltage and a size of the delay cell, for example.

In another embodiment, the oscillator 180 is implemented as an inductor-capacitor (LC) type oscillator. The frequency of the LC-type oscillator depends on inductance and capacitance of the LC-type oscillator. In an example, the capacitance of the LC-type oscillator is collectively determined by at least a varactor and a capacitor bank. The varactor has a voltage controlled capacitor, and the capacitor bank has a plurality of capacitors that can be selectively included in the LC-type oscillator. The proportional signal and the integral signal are separately used to control the capacitance of the varactor and the number of selected capacitors in the capacitor bank, for example.

The proportional path 150 includes any suitable circuits to adjust the controllable parameter, such as C1 of the oscillator 180, based on the proportional signal. In an example, the proportional path 150 uses the UP and DN signal pair to control switches in the oscillator 180. In another example, the proportional path 150 includes a digital to analog converter to convert the UP and DN signal pair to an analog signal, and uses the analog signal to adjust the controllable parameter. In an embodiment, the proportional path 150 uses a relatively high path gain, and responds to phase noise in the oscillating signal OUT with relatively high speed to allow a relatively high PLL bandwidth to suppress phase noise.

The integral path 160 includes any suitable circuits to adjust the controllable parameter, such as C2 of the oscillator 180, based on the integral signal. In an embodiment, the integral path 160 includes a regulator 170, such as a voltage regulator, a current regulator, and the like to regulate a control signal based on the integral signal, and uses the control signal to control the controllable parameter C2. In an example, the regulator 170 is a voltage regulator that regulates a voltage supply of oscillator 180 based on the integral signal. The integral path 160 uses the regulator 170 to suppress the noise from a power supply source, and thus improves power supply rejection ratio (PSRR) of the PLL 100.

It is noted that the PLL 100 can include other suitable components. In a frequency multiplication example, a frequency divider can be used to divide the frequency of OUT by N (N is an integer number). Then, the frequency-divided OUT is provided to the detection block 110. Thus, the frequency of the OUT is N times of the frequency of REF.

Figure 2:
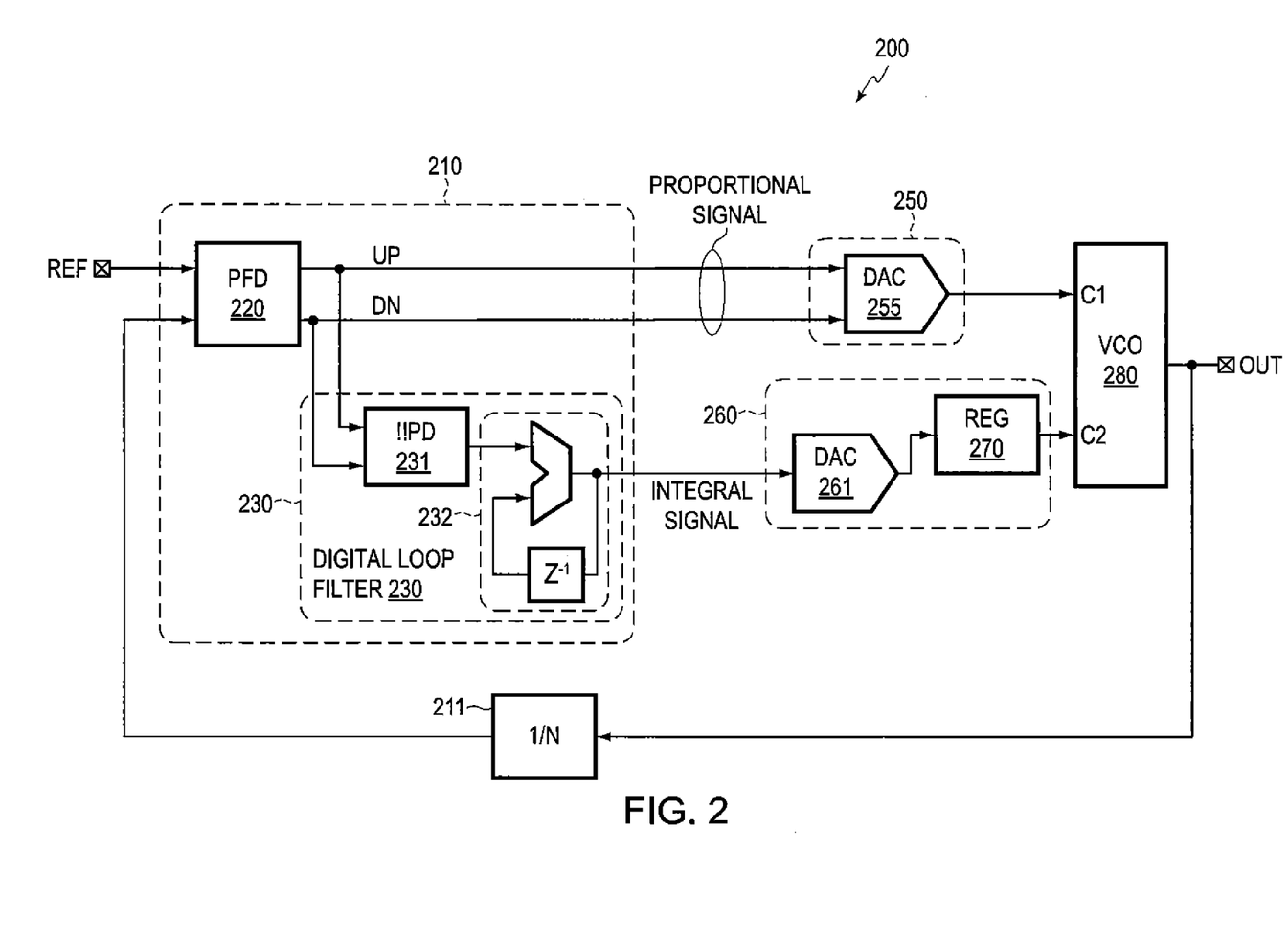
FIG. 2 shows an exemplary block diagram of another phase-locked loop 200 according to an embodiment of the disclosure.

FIG. 2 shows an exemplary block diagram of another PLL 200 according to an embodiment of the disclosure. The PLL 200 generates an output signal (OUT) based on a reference signal (REF). In FIG. 2, the PLL 200 includes a frequency divider 211 that frequency divides OUT by N (N is an integer number), and thus the PLL 200 can be used in a frequency multiplication circuit. The PLL 200 includes a detection block 210 that generates a proportional signal indicative of a phase difference between the frequency-divided OUT and REF, and an integral signal indicative of a relatively low frequency component of the phase difference, a voltage controlled oscillator (VCO) 280 having at least two controllable parameters C1 and C2, a proportional path 250 that controls C1 based on the proportional signal, and an integral path 280 that controls C2 based on the integral signal. These elements are coupled together as shown in FIG. 2.

The detection block 210 includes a phase frequency detector (PFD) 220 and a digital loop filter 230. The digital loop filter 230 includes a bang-bang phase detector (!!PD) 231 and an accumulator 232. The PFD 220 receives the frequency-divided OUT and the REF, and generates a pair of signals (UP and DN) with variable-width pulses. The widths of the pulses are varied based on the phase difference between the frequency-divided OUT and REF. For example, when the frequency-divided OUT is ahead of REF by a positive phase difference, the DN signal has a wider pulse width that is proportional to the positive phase difference. When the frequency-divided OUT is behind REF by a positive phase difference, the UP signal has a wider pulse width that is proportional to the positive phase difference.

According to an aspect of the disclosure, UP and DN can also correspond to a three-level digital proportional signal. The three levels are the frequency-divided OUT being ahead of REF, the frequency-divided OUT tracking REF, and frequency-divided OUT being behind REF. In an example, when UP is logic "0" and DN is logic "1", the three-level digital proportional signal indicates the frequency-divided OUT being ahead of REF; when UP is logic "1" and DN is logic "0", the three-level digital proportional signal indicates the frequency-divided OUT being behind REF; and when both UP and DN are logic "1" or "0", the three-level digital proportional signal indicates the frequency-divided OUT tracking REF.

In the digital loop filter 230, the !!PD 231 (also known as Bang-Bang PD) converts the UP and DN to a digital phase error, such as a two-state signal (1 or −1), and the like. The !!PD 231 may be constructed with a D-type flip-flop that receives the UP and DN at D input terminal and clock terminal, respectively. The accumulator 232 accumulates the digital phase error to remove high frequency components. In an example, the accumulator 232 can be implemented as an adder circuit coupled to a register circuit.

It is noted that the digital loop filter 230 can include other suitable components. In an example, the digital loop filter 230 includes a decimating circuit (not shown) between the !!PD 231 and the accumulator 232. The decimating circuit can allow the accumulator to operate at relatively low frequency. It is also noted that !!PD 231 can be replaced by other suitable digital phase detector, such as multiple-bit digital phase detector, and the like.

The VCO 280 generates the oscillating signal OUT based on at least two controllable parameters, such as C1 and C2, that are separately controlled based on the proportional signal and the integral signal. The frequency of the oscillating signal OUT is adjusted according to the control parameters. In the FIG. 2 example, the controllable parameters C1 and C2 are controlled by analog signals.

The proportional path 250 includes any suitable circuits to adjust the controllable parameter C1 based on the proportional signal (UP and DN). In the FIG. 2 example, the proportional path 250 includes a digital to analog converter (DAC) 255. The DAC 255 converts the three-level digital proportional signal (UP and DN) into an analog signal, and uses the analog signal to control the controllable parameter C1. This analog signal can be either a voltage signal applied to the VCO 280 or a current signal in the case of a current controlled oscillator. It is noted that the proportional path 250 can include other suitable circuit components, such as an amplifier that adjusts a path gain for the proportional path 250, and the like.

The integral path 260 includes any suitable circuits to adjust the controllable parameter C2 of the VCO 280 based on the integral signal. In FIG. 2, the integral path 260 includes a DAC 261 and a regulator (REG) 270. The DAC 261 converts the integral signal from digital form to analog form. In an example, the regulator 270 is a voltage regulator that regulates a voltage supply of VCO 280 based on the integral signal. The regulator 270 suppresses the noise from a power supply source, and thus improves power supply rejection ratio (PSRR).

According to an aspect of the disclosure, the detection block 210 is implemented using digital circuits. This digital circuit assisted implementation of PLL 200 provides improved immunity to process, voltage, and temperature (PVT) variations. Further, the digital circuit assisted implementation of PLL 200 can be easily ported from one process to another process, because the digital circuits scale gracefully from one process to another process.

In addition, digital circuits can be compacted in a relatively small layout area, the PLL 200 can have a relatively small footprint. Further, digital circuits consume less power, and thus the PLL 200 can have reduced power consumption.

According to another aspect of the disclosure, the PLL 200 utilizes PFD 220 and !!PD 231 to generate the digital phase error, and can reduce the deterministic jitter from phase error quantization compared to using a time-to-digital converter (TDC) to generate the digital phase error.

Further, the PLL 200 uses separate proportional path 250 and the integral path 260 to respectively control different controllable parameters of the VCO 280. The proportional path 250 can be implemented with relatively high path gain to allow a relatively high bandwidth to suppress VCO phase noise.

Figure 3:
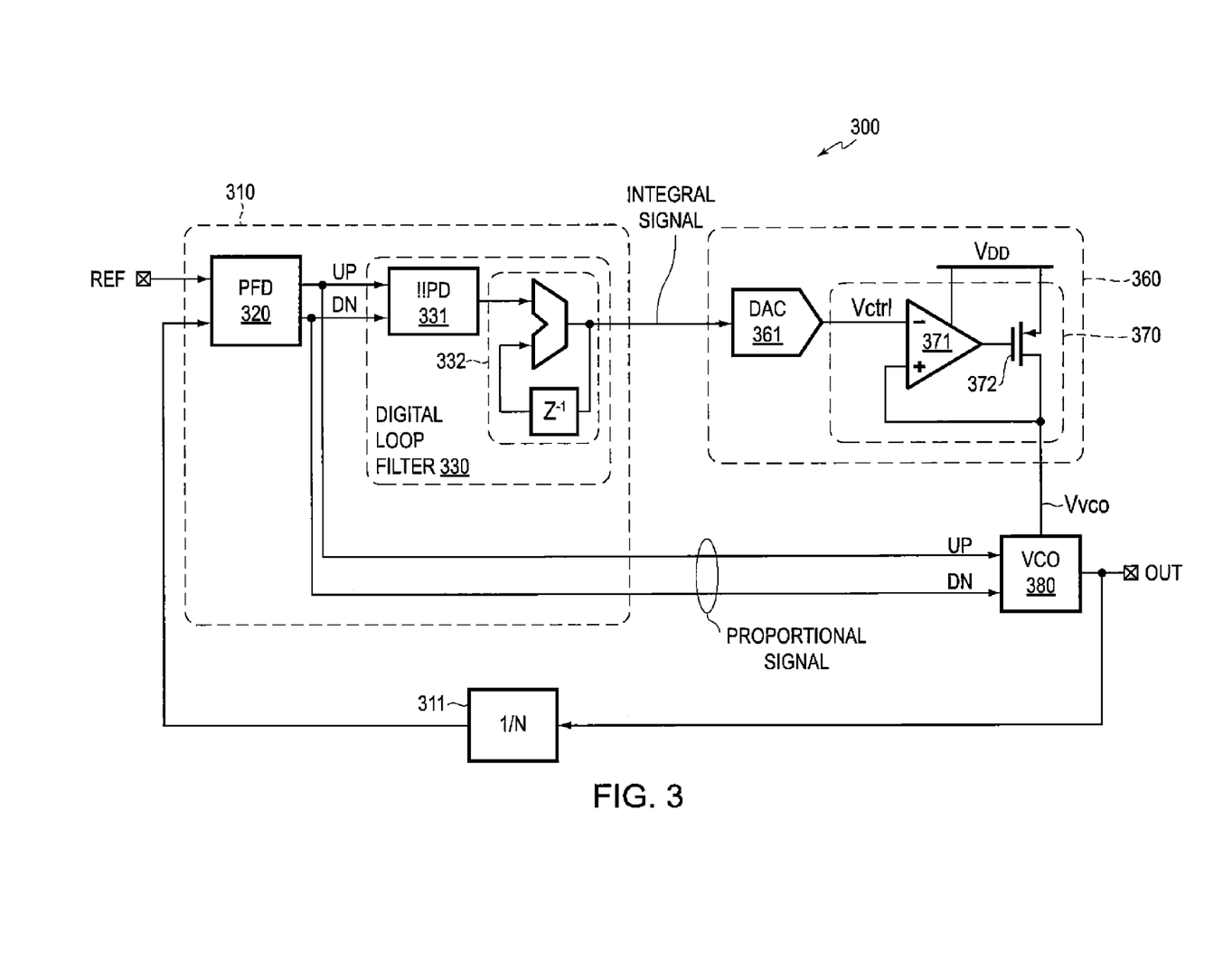
FIG. 3 shows an exemplary block diagram of another phase-locked loop 300 according to an embodiment of the disclosure.

FIG. 3 shows an exemplary block diagram of another PLL 300 according to an embodiment of the disclosure. The PLL 300 also utilizes certain components that are identical or equivalent to those used in the PLL 200; the description of these components has been provided above and will be omitted here for clarity purposes.

In the FIG. 3 example, the proportional signal (UP and DN) is directly used to adjust the control parameters of the VCO 380. The proportional path is embedded in the VCO 380.

Further, in the FIG. 3 example, the integral path includes a DAC 361 and a voltage regulator 370. The regulator 370 includes an operational amplifier (OA) 371 and a P-type metal-oxide-semiconductor (PMOS) transistor 372. The source terminal of the PMOS transistor 372 is coupled to a power supply VDD, the drain terminal of the PMOS transistor 372 is coupled to the VCO 380 to provide a supply voltage Vvco to a power supply terminal of the VCO 380. The output of the OA 371 controls the gate terminal of the PMOS transistor 372.

The DAC 361 converts the integral signal to a control voltage Vctrl. The OA 371 compares the control voltage Vctrl with the voltage Vvco provided to the VCO 380, and adjusts the gate voltage of the PMOS transistor 372 based on the comparison, such that the voltage Vvco tracks the control voltage Vctrl. The regulator 370 suppresses the noise from the power supply VDD, and thus improves power supply rejection ratio (PSRR) of the PLL 300.

Figure 4A:
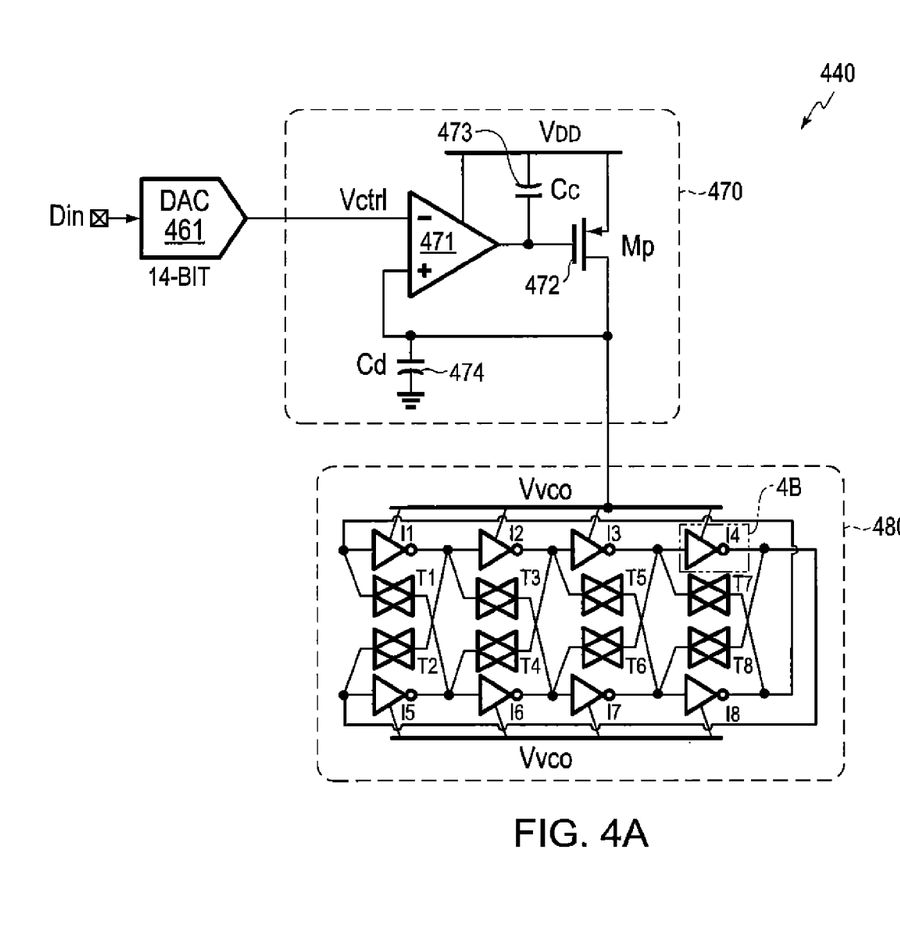
FIGS. 4A and 4B show exemplary block diagrams of a digital-controlled oscillator 440 according to an embodiment of the disclosure.
Figure 4B:
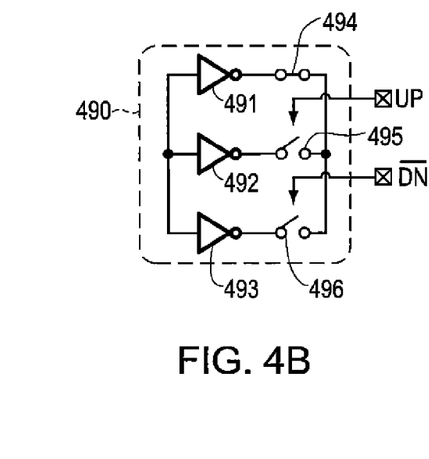

FIGS. 4A and 4B show exemplary block diagrams of a digital-controlled oscillator 440 according to an embodiment of the disclosure. The digital-controlled oscillator 440 can be used in the PLL 300 as the combination of the integral path 360 and the VCO 380.

The digital-controlled oscillator 440 includes a DAC 461, a voltage regulator 470, and a VCO 480. These elements are coupled together as shown in FIG. 4A.

The DAC 461 receives the integral signal in the digital form (Din), and generates a control voltage Vctrl corresponding to the analog form of the integral signal. In FIG. 4A, the DAC 461 is a 14-bit digital to analog converter. The DAC 461 may include a sigma-delta modulator (not shown) that suppresses quantization noise. However it should be understood that the DAC 461 can have any configuration to have any suitable resolution.

The voltage regulator 470 includes an OA 471 and a PMOS transistor 472. The source terminal of the PMOS transistor 472 is coupled to a power supply VDD, the drain terminal of the PMOS transistor 472 is coupled to the VCO 480 to provide a voltage Vvco to the VCO 480. The output of the OA 471 controls the gate terminal of the PMOS transistor 372. In addition, the voltage regulator 470 includes a first capacitor 473 and a second capacitor 474. The first capacitor 473 is coupled to the VDD and the output of the OA 471, and the second capacitor 474 is coupled to the Vvco and the ground.

According to an embodiment of the disclosure, the voltage regulator 470 is a two-pole system where the two poles can be suitably controlled by selecting the suitable capacitance for the first capacitor 473 and the second capacitor 474. In an embodiment, one of the two poles can be suitably controlled to be dominant to avoid poor transient response. According to an aspect of the disclosure, each of the two poles can be controlled to be dominant. In an example, the capacitance of the first capacitor 473 is selected to be relatively large to make the output pole dominant, and the voltage regulator 470 has improved PSRR. In another example, to save area and power, the capacitance of the first capacitor 473 is selected to make the output pole non-dominant.

In the FIG. 4A example, the VCO 480 includes four pseudo-differential stages connected in a ring oscillator topology. The first stage includes inverter modules I1 and I5, and transmission gates T1 and T2; the second stage includes inverter modules I2 and I6, and transmission gates T3 and T4; the third stage includes inverter modules I3 and I7, and transmission gates T5 and T6; and the fourth stage includes inverter modules I4 and I8, and transmission gates T7 and T8. In an embodiment, in each stage, the transmission gates are configured to be already on, and are coupled to the inverter modules in a feed-forward manner to achieve pseudo-differential stages. The VCO 480 generates total 8 phases from the four stages.

In the FIG. 4A example, the DAC 461 and the voltage regulator 470 form the integral path to control a supply voltage Vvco to each of the inverter modules I1-I8, and the proportional path is embedded in the inverter modules I1-I8.

Each of the inverter modules 4B in FIG. 4A may have a construction shown in FIG. 4B, for example. The inverter module 490 shown in FIG. 4B includes three branches that are coupled in parallel. The first branch includes an inverter 491, and a switch 494 that is always closed; the second branch includes an inverter 492, and a switch 495 that is controlled by UP; and the third branch includes an inverter 493 and a switch 496 that is controlled by an inversion of DN ($\overline{DN}$). In another words, the switch 495 is open when UP is logic "0", and is closed when UP is logic "1"; and the switch 496 is open when $\overline{DN}$ is logic "0" (DN is logic "1"), and is closed when $\overline{DN}$ is logic "1" (DN is logic "0").

It is noted that each of the branches can include more than one inverter, and the inverters in the different branches can be formed of transistors having the same width to length ratio or different width to length ratio. In an embodiment, the inverter 491 is formed of transistors having relatively larger width to length ratio than the inverters 492 and 493.

The inverter module 490 is configured to have three different delays based on the proportional signal (UP and DN). In an example, when one of the switches 495 and 496 is closed and the other is open, the inverter module 490 has a medium delay; when the switch 495 and the switch 496 are both closed, the inverter module 490 has a smaller delay than the medium delay; and when the switch 495 and the switch 496 are both open, the inverter module 490 has a larger delay than the medium delay. That is, the inverters in two of the branches are used as selectable circuit components. The proportional signal selects the selectable circuit components to adjust the delay of the inverter module 490.

During operation, in an example, when both UP and DN are logic "1" or logic "0", the three-level digital proportional signal indicates that an output of VCO 480 tracks the phase of a reference signal. One of the switches 495 and 496 is closed, and the other is open. Then, the inverter module 490 keeps the medium delay.

When UP is logic "1" and DN is logic "0", the three-level digital proportional signal indicates that the phase of the output of the VCO 480 is behind the reference signal. The switch 495 and the switch 496 are both closed. Then, the inverter module 490 has a smaller delay than the medium delay to speed up the output of the VCO 480, and pull the phase of the output of the VCO 480 in the direction of the reference signal.

When UP is logic "0" and DN is logic "1", the three-level digital proportional signal indicates the phase of the output of the VCO 480 output is ahead of the reference signal. Both of the switches 495 and 496 are open. Then, the inverter module 490 has a larger delay than the medium delay to slow down the output of VCO 480, and pull the phase of the output of the VCO 480 in the direction of the reference signal.

Figure 5:
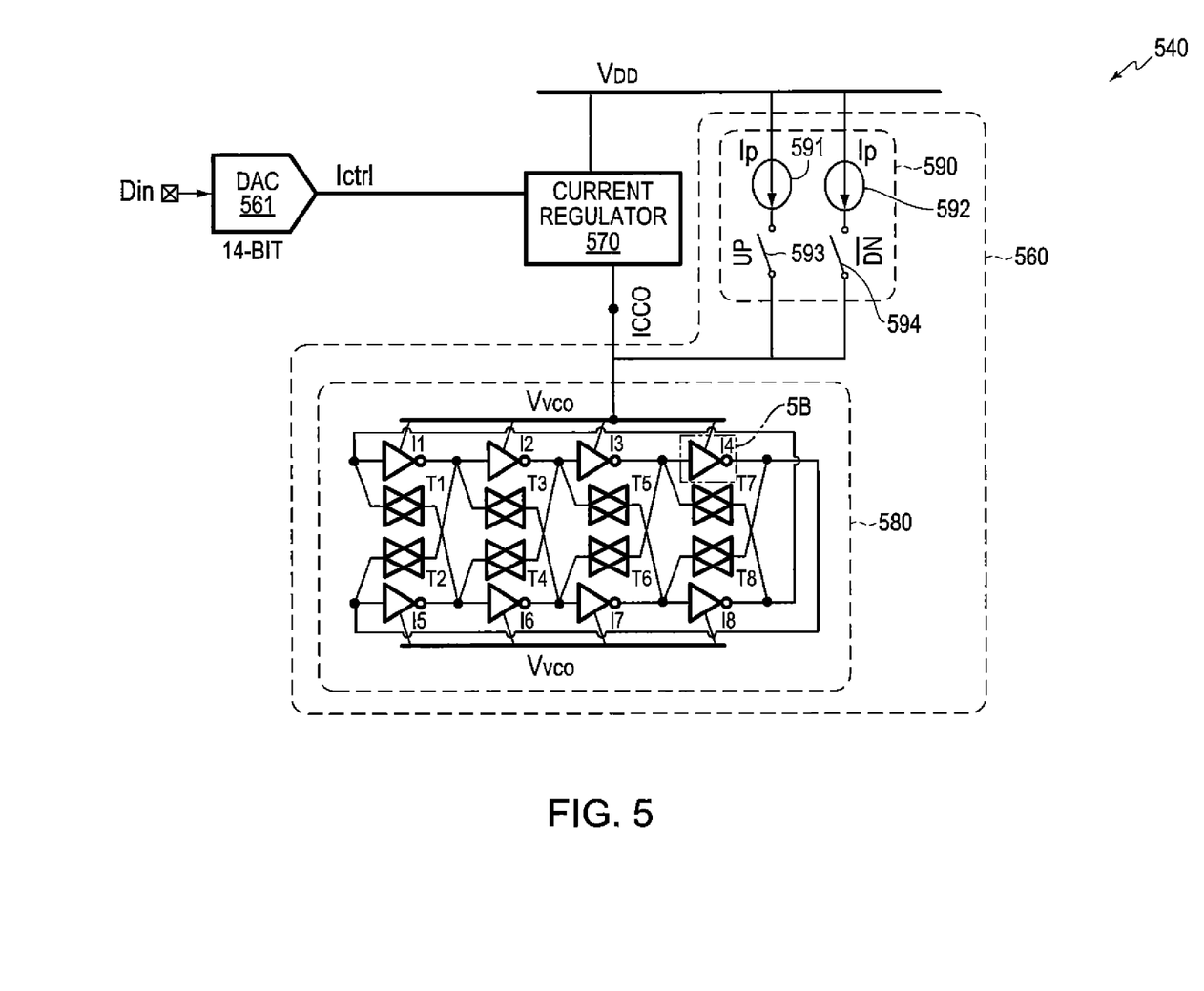
FIG. 5 shows an exemplary block diagram of another digital-controlled oscillator 540 according to an embodiment of the disclosure.

FIG. 5 shows an exemplary block diagram of another digital-controlled oscillator 540 according to an embodiment of the disclosure. The digital-controlled oscillator 540 also utilizes certain components that are identical or equivalent to those used in the digital-controlled oscillator 440. The description of these components has been provided above and will be omitted here for clarity purposes.

The integral path includes a DAC 561 and a current regulator 570. The DAC 561 receives the integral signal in the digital form (Din), and generates a control current Ictrl corresponding to the analog form of the integral signal. In FIG. 5, the DAC 561 is a 14-bit digital to analog converter. It is noted that the DAC 561 can have any other suitable number of bits.

The current regulator 570 controls a current ICCO to the ring oscillator 580 based on the control current Ictrl. The current regulator 570 provides similar power supply noise rejection feature as the voltage regulator 470.

In an embodiment shown in FIG. 5, the oscillator 560, which is now a current controlled oscillator (CCO), includes the ring oscillator 580 and an additional current module 590. The additional current module 590, which receives control signals from the proportional path, includes two current branches coupled in parallel. The first current branch includes a current source 591 and a switch 593; and the second current branch includes a current source 592 and a switch 594. The current sources 591 and 592 are used as selectable circuit components to adjust the oscillation frequency of the oscillator 560.

When one of the switches is open, and the other switch is closed, the additional current module 590 provides a medium level additional current. When both switches are open, the additional current module 590 provides no additional current; and when both switches are closed, the additional current module 590 provides a higher level additional current.

In the FIG. 5 example, when both UP and DN are logic "1" or logic "0", the three-level digital proportional signal indicates that an output of CCO 560 tracks the phase of a reference signal. One of the switches 593 and 594 is open, and the other is closed. Then, the additional current module 590 provides a medium level additional current.

When UP is logic "1" and DN is logic "0", the three-level digital proportional signal indicates that the phase of the output of the CCO 560 is behind the reference signal. The switch 593 and the switch 594 are both closed. Then, the additional current module 590 provides a higher level of additional current to speed up the output of the CCO 560, and pulls the phase of the output of the CCO 560 in the direction of the reference signal.

When UP is logic "0" and DN is logic "1", the three-level digital proportional signal indicates the phase of the output of the CCO 560 output is ahead of the reference signal. The both switches 593 and 594 are open. Then, additional current module 590 provides no additional current, slows down the output of CCO 560, and pulls the phase of the output of the CCO 560 in the direction of the reference signal.

It is noted that the inverter module 5B within the ring oscillator 580 may have selectable circuit components to adjust the inverter module delay. For example, each of the inverter modules 5B may include an inverter, load capacitors, and switches that connect/disconnect the load capacitors to the output terminal of the inverter. The proportional path can be configured similar to FIG. 4B to control the switches to increase/decrease the value of the load capacitance so that the inverter module delay is adjusted. In practice, generally, the additional current module 590 or the selectable circuit components in the inverter modules 5B can be individually used to adjust the inverter module delay, but it should be understood that both can be used without departing from the present disclosure.

Figure 6:
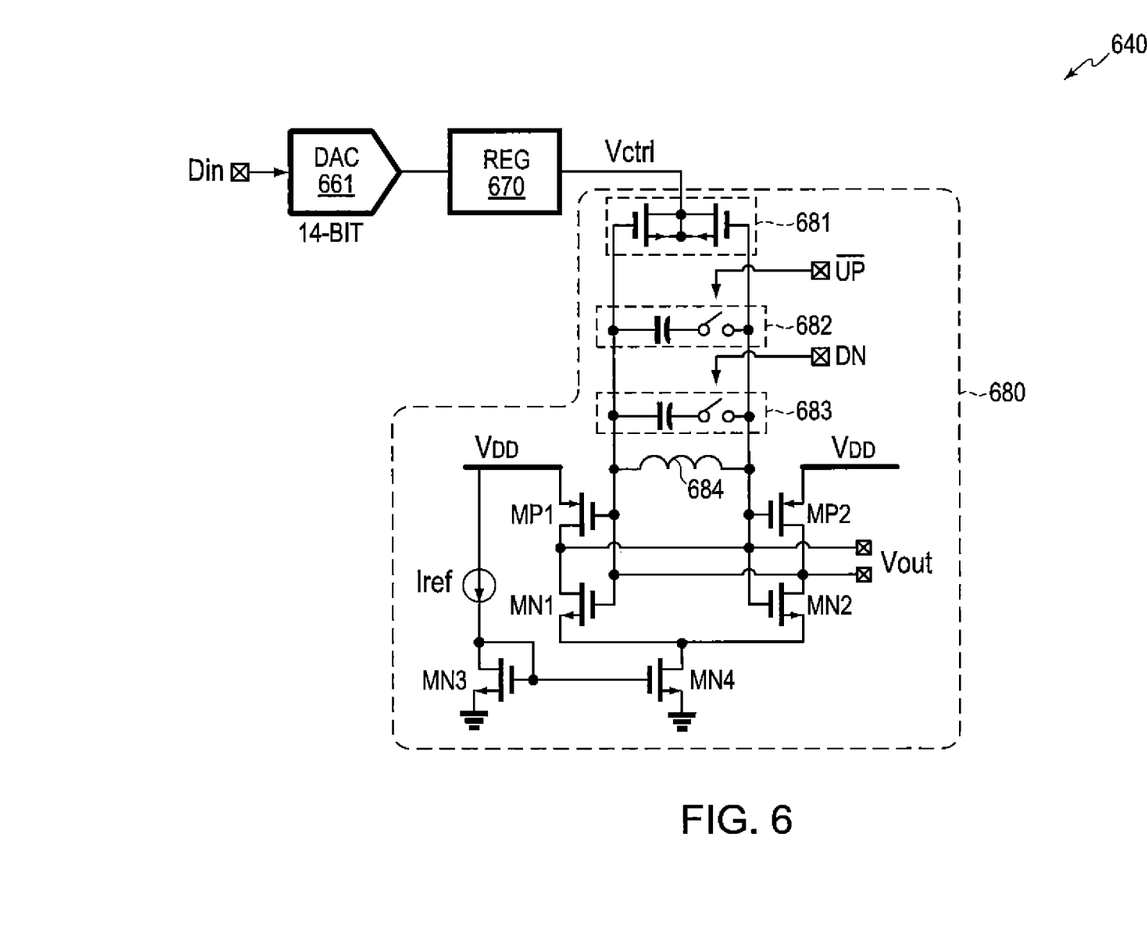
FIG. 6 shows an exemplary block diagram of another digital-controlled oscillator 640 according to an embodiment of the disclosure.

FIG. 6 shows an exemplary block diagram of another digital-controlled oscillator example 640 according to an embodiment of the disclosure. The DAC 661 and voltage regulator 670 are identical or equivalent to the DAC 461 and the voltage regulator 470. The description of these components has been provided above and will be omitted here for clarity purposes.

The digital-controlled oscillator 640 includes a LC-type oscillator 680. The LC-type oscillator 680 includes an inductor unit 684, a first capacitor unit 681, and two switchable capacitors 682 and 683. The first capacitor unit 681 is controlled by the control voltage Vctrl, which is the analog form of the integral signal (Din). The two switchable capacitors 682 and 683, which are provided as selectable circuit components, are controlled by the proportional signal (UP and DN).

Further, the LC-type oscillator 680 includes transistors MN1 and MP1 in serial connection, and transistors MN2 and MP2 in serial connection as shown in FIG. 6. The transistors MN1 and MP1, and the transistors MN2 and MP2 are cross-coupled in a differential form to drive a pair of outputs Vout. The current reference Iref, and transistors MN3 and MN4 are configured in a current mirror to provide a current to the LC-type oscillator 680.

In FIG. 6, the first capacitor unit 681 includes a pair of matching varactors that have a voltage-controlled capacitance. The anodes of the pair of matching varactors are respectively coupled to the pair of outputs, and the cathodes of the pair of matching varactors are controlled by the control voltage Vctrl. Each of the two switchable capacitors 682 and 683 is coupled between the pair of outputs. The inductor 684 is also coupled between the pair of outputs.

The two switchable capacitors 682 and 683 are controlled to provide additional parallel capacitance between the pair of outputs. In an example, when one of the switchable capacitors 682 and 683 is switched into the LC-type oscillator 680, the capacitance of the LC-type oscillator 680 is at a medium level; when both are switched into the LC-type oscillator 680, the capacitance of the LC type oscillator 680 is larger than the medium level; and when both are switched out of the LC type oscillator 680, the capacitance of the LC type oscillator 680 is lower than the medium level.

In the FIG. 6 example, when both UP and DN are logic "1" or logic "0", the three-level digital proportional signal indicates that an output of LC-type oscillator 680 tracks the phase of a reference signal. One of the switchable capacitors 682 and 683 is switched in the LC-type oscillator 680 and the other is switched out of the LC-type oscillator 680. Then, the capacitance of the LC-type oscillator 680 is at the medium level.

When UP is logic "1" and DN is logic 0", the three-level digital proportional signal indicates that the phase of the output of the LC-type 680 is behind the reference signal. Both of the switchable capacitors 682 and 683 are switched out. Then, the capacitance of the LC-type oscillator 680 is smaller than the medium level to speed up the output of the LC-type 680, and pull the phase of the output of the LC-type 680 in the direction of the reference signal.

When UP is logic "0" and DN is logic "1", the three-level digital proportional signal indicates the phase of the output of the LC-type 680 output is ahead of the reference signal. Both of the switchable capacitors 682 and 683 are switched in the LC-type oscillator 680. Then, the capacitance of the LC-type oscillator 680 is larger than the medium level to slow down the output of the LC-type 680, and pull the phase of the output of the LC-type 680 in the direction of the reference signal.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A phase-locked loop circuit, comprising:
an oscillator that generates an oscillation signal, the oscillator having a power-supply terminal and a control terminal;

a detection block that detects a phase difference between a phase of the oscillation signal and a phase of a reference signal and generates an integral signal that represents an integral value of the phase difference and a proportional signal that represents a current value of the phase difference;

an integral path including a regulator that receives the integral signal and supplies a regulated integral signal to the power-supply terminal of the oscillator, the regulator having a feedback loop including an error amplifier; and a proportional path to supply the proportional signal, separately from the integral signal, to the control terminal of the oscillator to adjust a delay parameter of the oscillator, wherein the oscillator generates the oscillation signal having an oscillation frequency controlled by both of the regulated integral signal and the proportional signal such that the phase of the oscillation signal is locked to the phase of the reference signal, the integral path supplies the regulated integral signal to the power-supply terminal of the oscillator in an analog form, the proportional path supplies the proportional signal to the control terminal of the oscillator in a digital form to select selectable circuit components to adjust the oscillation frequency, the regulator is a voltage regulator, the oscillator is a voltage-controlled oscillator that generates the oscillation signal having the oscillation frequency dependent on a voltage of the regulated integral signal, the oscillator is a ring oscillator having a plurality of delay cells connected in series, each of the delay cells includes a plurality of branches including respective inverters and switches to connect the inverters in parallel with each other, the proportional signal selects a number of the branches connected in parallel in each of the delay cells.

2. The phase-locked loop circuit according to claim 1, further comprising a divider that divides the oscillation signal to generate a divided oscillation signal, wherein the detection block detects the phase difference by comparing a phase of the divided oscillation signal and the phase of the reference signal.

3. The phase-locked loop circuit according to claim 1, wherein:

the detection block generates, as the proportional signal, up and down signals based on the phase difference; and the proportional path supplies the up and down signals to the control terminal of the oscillator.

4. A phase-locked loop circuit, comprising:

an oscillator that generates an oscillation signal;

a detection block that detects a phase difference between a phase of the oscillation signal and a phase of a reference signal and generates an integral signal that represents an integral value of the phase difference and a proportional signal that represents a current value of the phase difference;

an integral path including a regulator that receives the integral signal and supplies a regulated integral signal to the oscillator, the regulator having a feedback loop including an error amplifier; and a proportional path that supplies the proportional signal, separately from the integral signal, to the oscillator to control a delay parameter of the oscillator, wherein the oscillator generates the oscillation signal having an oscillation frequency controlled by both of the regulated integral signal and the proportional signal such that the phase of the oscillation signal is locked to the phase of the reference signal, the oscillator is an inductor-capacitor (LC) type oscillator having at least a varactor and a plurality of selectable capacitors, the integral path provides the regulated integral signal to adjust a capacitance of the varactor, and the proportional signal selects a number of the selectable capacitors in the oscillator to adjust the delay parameter.

5. The phase-locked loop circuit according to claim 4, wherein:

the detection block generates, as the proportional signal, up and down signals based on the phase difference; and the proportional path supplies the up and down signals to the oscillator.

6. The phase-locked loop circuit according to claim 4, wherein:

the integral path supplies the regulated integral signal to the oscillator in an analog form; and the proportional path supplies the proportional signal to the oscillator in a digital form to select selectable circuit components to adjust the oscillation frequency.

7. A method of improving a power supply rejection ratio of a phase-locked loop circuit, comprising:

generating an oscillation signal having an oscillation frequency by using an oscillator having a power-supply terminal and a control terminal;

detecting a phase difference between a phase of the oscillation signal and a phase of a reference signal and generating an integral signal that represents an integral value of the phase difference and a proportional signal that represents a current value of the phase difference;

regulating the integral signal using a regulator having a feedback loop including an error amplifier and supplying the regulated integral signal to the power-supply terminal of the oscillator; and supplying the proportional signal, separately from the integral signal, to the control terminal of the oscillator to adjust a delay parameter of the oscillator, wherein the generating of the oscillation signal includes controlling the oscillation frequency by using both of the regulated integral signal and the proportional signal such that the phase of the oscillation signal is locked to the phase of the reference signal, the supplying of the regulated integral signal includes supplying the regulated integral signal to the power-supply terminal of the oscillator in an analog form, the supplying of the proportional signal includes supplying the proportional signal to the control terminal of the oscillator in a digital form to select selectable circuit components to adjust the oscillation frequency by adjusting the delay parameter, the regulator is a voltage regulator, the oscillator is a voltage-controlled oscillator that generates the oscillation signal having the oscillation frequency dependent on a voltage of the regulated integral signal, the oscillator is a ring oscillator having a plurality of delay cells connected in series, each of the delay cells includes a plurality of branches including respective inverters and switches to connect the inverters in parallel with each other, and the generating of the oscillation signal includes selecting, based on the proportional signal, a number of the branches connected in parallel in each of the delay cells.

8. The method according to claim 7, further comprising dividing the oscillation signal to generate a divided oscillation signal, wherein the detecting detects the phase difference by comparing a phase of the divided oscillation signal and the phase of the reference signal.

9. The method according to claim 7, wherein:

the generating of the proportional signal includes generating up and down signals based on the phase difference; and the supplying of the proportional signal includes supplying the up and down signals to the control terminal of the oscillator.

10. A method of improving a power supply rejection ratio of a phase-locked loop circuit, comprising:

generating an oscillation signal having an oscillation frequency by using an oscillator;

detecting a phase difference between a phase of the oscillation signal and a phase of a reference signal and generating an integral signal that represents an integral value of the phase difference and a proportional signal that represents a current value of the phase difference;

regulating the integral signal using a regulator having a feedback loop including an error amplifier and supplying the regulated integral signal to the oscillator; and supplying the proportional signal, separately from the integral signal, to the oscillator to adjust a delay parameter of the oscillator, wherein the generating of the oscillation signal includes controlling the oscillation frequency by using both of the regulated integral signal and the proportional signal such that the phase of the oscillation signal is locked to the phase of the reference signal, the oscillator is an inductor-capacitor type oscillator having at least a varactor and a plurality of selectable capacitors, and the generating of the oscillation signal includes:

adjusting, based on the regulated integral signal, a capacitance of the varactor, and selecting, based on the proportional signal, a number of the selectable capacitors in the oscillator.

11. The method according to claim 10, wherein:

the generating of the proportional signal includes generating up and down signals based on the phase difference; and the supplying of the proportional signal includes supplying the up and down signals to the oscillator.

12. The method according to claim 10, wherein:

the supplying of the regulated integral signal includes supplying the regulated integral signal to the oscillator in an analog form; and the supplying of the proportional signal includes supplying the proportional signal to the oscillator in a digital form to select selectable circuit components to adjust the oscillation frequency.

* * * * *